United States Patent
Chen

(10) Patent No.: US 10,270,242 B2
(45) Date of Patent: Apr. 23, 2019

(54) MULTI-CHANNEL TRANSIENT VOLTAGE SUPPRESSOR

(71) Applicant: uPI Semiconductor Corp., Hsinchu County (TW)

(72) Inventor: Chih-Hao Chen, Hsinchu County (TW)

(73) Assignee: uPI Semiconductor Corp., Hsinchu County (TW)

(*) Notice: Subject to any disclaimer, the term of this patent is extended or adjusted under 35 U.S.C. 154(b) by 262 days.

(21) Appl. No.: 15/183,758

(22) Filed: Jun. 15, 2016

(65) Prior Publication Data
US 2017/0302072 A1 Oct. 19, 2017

(30) Foreign Application Priority Data
Apr. 14, 2016 (TW) .................. 105111585

(51) Int. Cl.
*H02H 9/04* (2006.01)
*H05K 1/02* (2006.01)
*H02H 3/20* (2006.01)
*H02H 9/00* (2006.01)
*H01L 31/044* (2014.01)
*H01L 27/02* (2006.01)

(52) U.S. Cl.
CPC .............. *H02H 9/04* (2013.01); *H02H 9/046* (2013.01); *H05K 1/0259* (2013.01); *H01L 27/0255* (2013.01); *H01L 31/044* (2014.12); *H02H 3/20* (2013.01); *H02H 9/005* (2013.01)

(58) Field of Classification Search
USPC .......................................... 361/56, 91.1, 111
See application file for complete search history.

(56) References Cited

U.S. PATENT DOCUMENTS 5,991,135 A * 11/1999 Saleh ...................... H01L 23/60
361/111
6,456,472 B1 * 9/2002 Beriault .............. H01L 27/0255
361/56
7,812,367 B2 10/2010 Salih et al.
(Continued)

FOREIGN PATENT DOCUMENTS

| CN | 101483175 | 7/2009 |
| CN | 101626020 | 1/2010 |
| CN | 102113117 | 6/2011 |

OTHER PUBLICATIONS

"Office Action of Taiwan Counterpart Application", dated Aug. 6, 2018, p. 1-p. 5.
(Continued)

*Primary Examiner* — Danny Nguyen
(74) *Attorney, Agent, or Firm* — JCIPRNET

(57) ABSTRACT

A multi-channel transient voltage suppressor includes a plurality of diode strings, a Zener diode and a diode array. The diode strings respectively have a plurality of input output terminals. The diode array includes a first bypass diode and a second bypass diode. The first bypass diode is coupled between a common bus and a ground terminal, and provides a forward turned-on path from the ground terminal to the common bus. The second bypass diode is coupled to the first bypass diode in parallel, and provides a reverse turned-on path from the common bus to the ground terminal. A current dissipation path is formed between each of the input output terminals and the ground terminal by the diode array.

7 Claims, 4 Drawing Sheets

(56) References Cited

U.S. PATENT DOCUMENTS

| | | |
|---|---|---|
| 7,880,223 B2 | 2/2011 | Bobde |
| 8,089,095 B2 | 1/2012 | Salih et al. |
| 8,199,447 B2 | 6/2012 | Gee et al. |
| 8,982,523 B2 * | 3/2015 | Kidger .................. H02H 9/005 361/111 |
| 2002/0093775 A1 | 7/2002 | Beriault |
| 2010/0006889 A1 * | 1/2010 | Marreiro ............. H01L 27/0255 257/106 |
| 2010/0039740 A1 * | 2/2010 | Jalilizeinali ............. H01L 23/60 361/56 |
| 2011/0163352 A1 * | 7/2011 | Gee ........................ H01L 23/60 257/173 |
| 2012/0218668 A1 | 8/2012 | Kidger et al. |
| 2013/0003242 A1 * | 1/2013 | Lin ....................... H02H 9/046 361/111 |
| 2016/0149402 A1 * | 5/2016 | Ye ......................... H02H 9/041 361/56 |

OTHER PUBLICATIONS

Office Action of China Counterpart Application, issued on Jan. 28, 2018, pp. 1-8.

* cited by examiner

MULTI-CHANNEL TRANSIENT VOLTAGE SUPPRESSOR

CROSS-REFERENCE TO RELATED APPLICATION

This application claims the priority benefit of Taiwan application serial no. 105111585, filed on Apr. 14, 2016. The entirety of the above-mentioned patent application is hereby incorporated by reference herein and made a part of this specification.

BACKGROUND OF THE INVENTION

1. Field of the Invention

The invention relates to a transient voltage suppressor, and more particularly, relates to a multi-channel transient voltage suppressor.

2. Description of Related Art

With rapid development of today's technology, integrated circuits have been widely applied in electronic devices. ESD (Electro Static Discharge) is one of the major problems in the field of integrated circuits and well known by person skilled in the art. Integrated circuits are prone to damages caused by an ESD event.

In conventional technical field, transient voltage suppressors (TVS) are usually used to conduct an ESD protection. Referring to FIG. 1A, which illustrates a circuit diagram of a conventional low-capacitance transient voltage suppressor. A transient voltage suppressor 100 includes a Zener diode ZD1 and a plurality of diodes DU11 to DU22, and DD11 to DD22. In order to reduce equivalent capacitances on current dissipation paths provided by the transient voltage suppressor, one or more diodes are usually arranged between input output terminals IOA1 and IOA2 and a power terminal PWR and between the input output terminals IOA1 and IOA2 and a ground terminal GND in conventional technical field so the equivalent capacitances on the current dissipation paths may be reduced through parasitic capacitances on the diodes connected in series.

However, as the number of channels of the transient voltage suppressor increases, the diodes additionally arranged on each channel may cause a circuit area required by the transient voltage suppressor to increase significantly (referring to a circuit diagram of a conventional multi-channel low-capacitance transient voltage suppressor as illustrated in FIG. 1B) and thereby dramatically increase circuit costs.

SUMMARY OF THE INVENTION

The invention provides a multi-channel transient voltage suppressor, which is capable of achieving the purpose of reducing the capacitance under the premise that the circuit area may be saved.

The multi-channel transient voltage suppressor of the invention includes a power terminal, a ground terminal, a common bus, a plurality of diode strings, a Zener diode and a diode array. The diode strings are coupled between the power terminal and the common bus. Each of the diode strings is coupled to one input output terminal. The Zener diode is coupled between the power terminal and the common bus. The diode array is coupled between the common bus and the ground terminal, and includes a first bypass diode and a second bypass diode. An anode of the first bypass diode is coupled to the ground terminal and a cathode of the second bypass diode, and an anode of the second bypass diode is coupled to the common bus and a cathode of the first bypass diode.

In an embodiment of the invention, each of the diode strings includes a first channeling diode and a second channeling diode. The first channeling diode and the second channeling diode are connected in series. The input output terminal is coupled to a common joint between the first channeling diode and the second channeling diode. Another terminal of the first channeling diode is coupled to the power terminal. Another terminal of the second channeling diode is coupled to the common bus.

In an embodiment of the invention, when an electrostatic discharge voltage higher than a ground terminal voltage exists in one of the input output terminals, a first current dissipation path passing through the input output terminal, the first channeling diode, the power terminal, the Zener diode, the common bus and the first bypass diode to the ground terminal is formed.

In an embodiment of the invention, when an electrostatic discharge voltage lower than a ground terminal voltage exists in one of the input output terminals, a second current dissipation path passing through the ground terminal, the second bypass diode, the common bus and one of the second channeling diodes to the input output terminal coupled to said one of the second channeling diodes is formed.

In an embodiment of the invention, the common bus includes an edge zone and a center zone and has a plurality of connection nodes. The diode array is connected to one of the connection nodes in the common bus.

In an embodiment of the invention, the diode array is connected to the connection node in the center zone.

In an embodiment of the invention, the diode array is connected to the connection node in the edge zone.

A multi-channel transient voltage suppressor of the invention includes a plurality of diode strings, a Zener diode and a diode array. The diode strings are coupled between a power terminal and a common bus, and each of the diode strings includes a corresponding input output terminal. The Zener diode is coupled between the power terminal and the common bus. The diode array includes a first bypass diode and a second bypass diode. The first bypass diode is coupled between the common bus and a reference ground terminal, and provides a first current dissipation path from the common bus to the reference ground terminal. The second bypass diode is coupled to the first bypass diode in reverse parallel, and provides a second current dissipation path from the reference ground terminal to the common bus.

Based on the above, the invention provides the diode array to be commonly used by the diode strings through the current dissipation paths so the equivalent capacitances on the current dissipation path may be effectively reduced by the turned-on first bypass diode or the turned-on second bypass diode in the diode array when the electrostatic discharge voltage is applied to the input output terminal. Accordingly, the circuit area of the multi-channel transient voltage suppressor is unlikely to increase significantly, and circuit costs may be effectively reduced without affecting the effectiveness of dissipating the electrostatic discharge current.

The invention is characterized in that, one diode array is commonly used by multiple diode strings so the number of diodes does not significantly increase due to the increasing number of the diode strings in the circuit. Aforesaid advantage of the invention is even more notable when the transient voltage suppressor has more channels.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
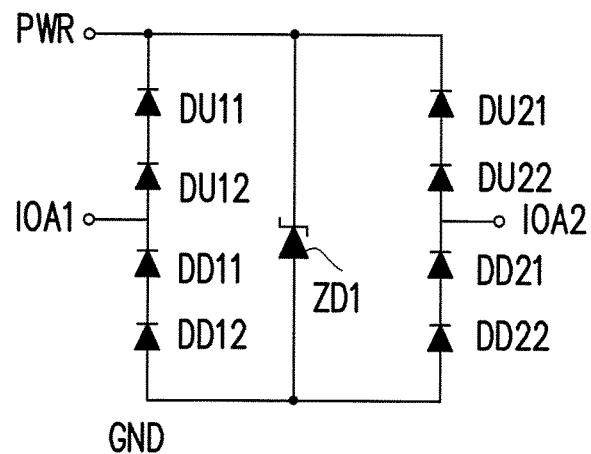
FIG. 1A illustrates a circuit diagram of a conventional low-capacitance transient voltage suppressor.
Figure 1B:
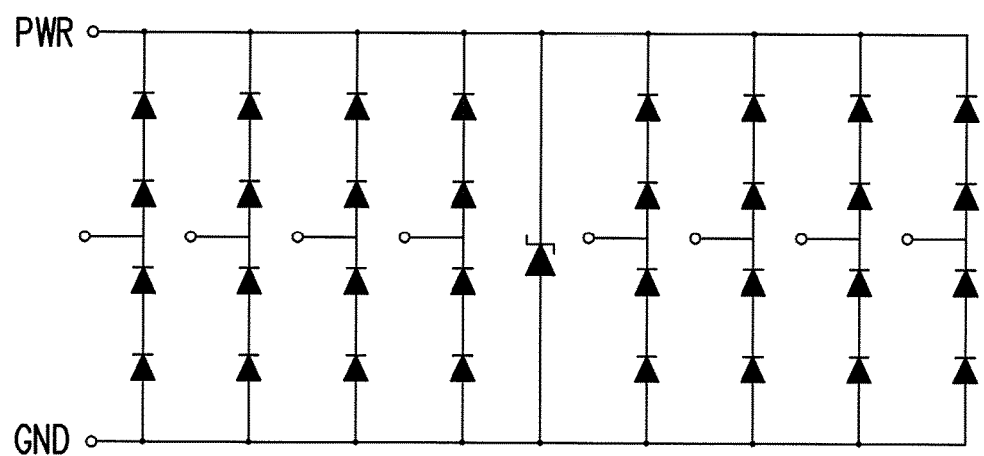
FIG. 1B illustrates a circuit diagram of a conventional multi-channel low-capacitance transient voltage suppressor.

Reference will now be made in detail to the present preferred embodiments of the invention, examples of which are illustrated in the accompanying drawings. Wherever possible, the same reference numbers are used in the drawings and the description to refer to the same or like parts.

Figure 2:
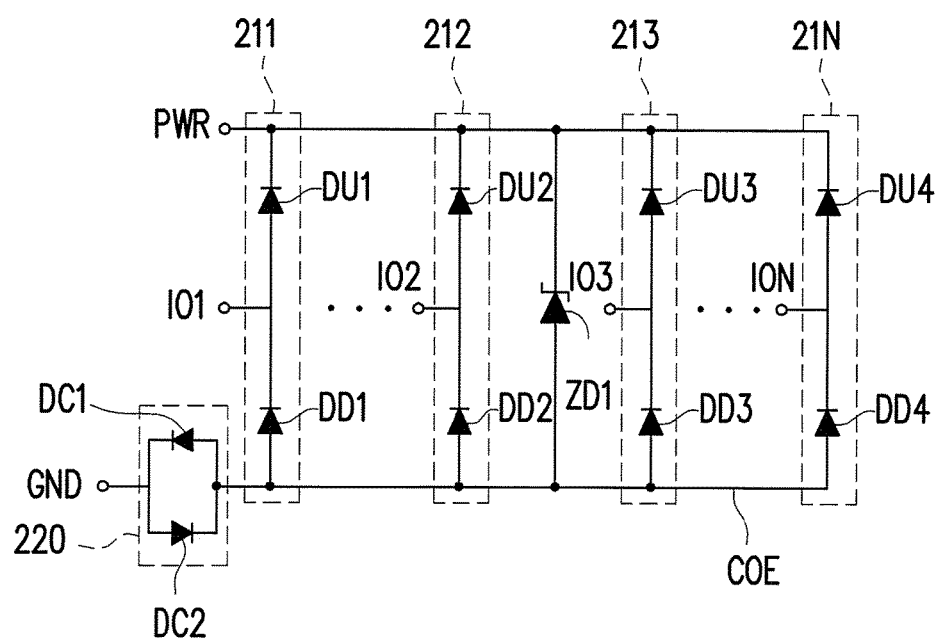
FIG. 2 is a schematic diagram illustrating a multi-channel transient voltage suppressor according to an embodiment of the invention.

Referring to FIG. 2, FIG. 2 is a schematic diagram illustrating a multi-channel transient voltage suppressor according to an embodiment of the invention. A multi-channel transient voltage suppressor 200 includes a plurality of diode strings 211 to 21N, a Zener diode ZD1, and a diode array 220. The diode strings 211 to 21N are formed by channeling diodes DU1 and DD1, channeling diodes DU2 and DD2, channeling diodes DU3 and DD3 and channeling diodes DU4 and DD4 connected in series, respectively. Each of the diode strings 211 to 21N is coupled between a power terminal PWR and a common bus COE, and the diode strings 211 to 21N are connected to each other in parallel. The diode strings 211 to 21N have a plurality of channels, and input output terminals IO1 to ION are formed at an terminal where two adjacent channeling diodes coupled in each of the diode strings 211 to 21N. In the example of the diode string 211, the diode string 211 includes the channeling diodes DU1 and DD1. A cathode of the channeling diode DU1 is coupled to the power terminal PWR, and an anode of the channeling diode DU1 is coupled to a cathode of the channeling diode DD1 and coupled to the input output terminal IO1. Further, an anode of the channeling diode DD1 is coupled to the common bus COE.

In the present embodiment, the Zener diode ZD1 is coupled between the power terminal PWR and the common bus COE. A cathode of the Zener diode ZD1 is coupled to the common bus COE and an anode of the Zener diode ZD1 is coupled to the power terminal PWR.

In the present embodiment, the diode array 220 is coupled to the common bus COE. The diode array 220 includes bypass diodes DC1 and DC2. The bypass diode DC1 is coupled between the common bus COE and the ground terminal GND, and the bypass diode DC2 is coupled to the bypass diode DC1 in parallel. More specifically, an anode of the bypass diode DC1 is coupled to the common bus COE, and a cathode of the bypass diode DC1 is coupled to the ground terminal GND. As such, when the bypass diode DC1 is turned on, the bypass diode DC1 may provide a turned-on path from the common bus COE to the ground terminal GND. Further, a cathode of the bypass diode DC2 is coupled to the common bus COE, and an anode of the bypass diode DC2 is coupled to the ground terminal GND. As such, when the bypass diode DC2 is turned on, the bypass diode DC2 may provide a turned-on path from the ground terminal GND to the common bus COE.

When the ESD phenomenon occurs, a current dissipation path is generated between any one of the input output terminals IO1 to ION and the ground terminal GND to dissipate the current generated by the ESD phenomenon, so as to achieve the effectiveness of the ESD protection.

Figure 3A:
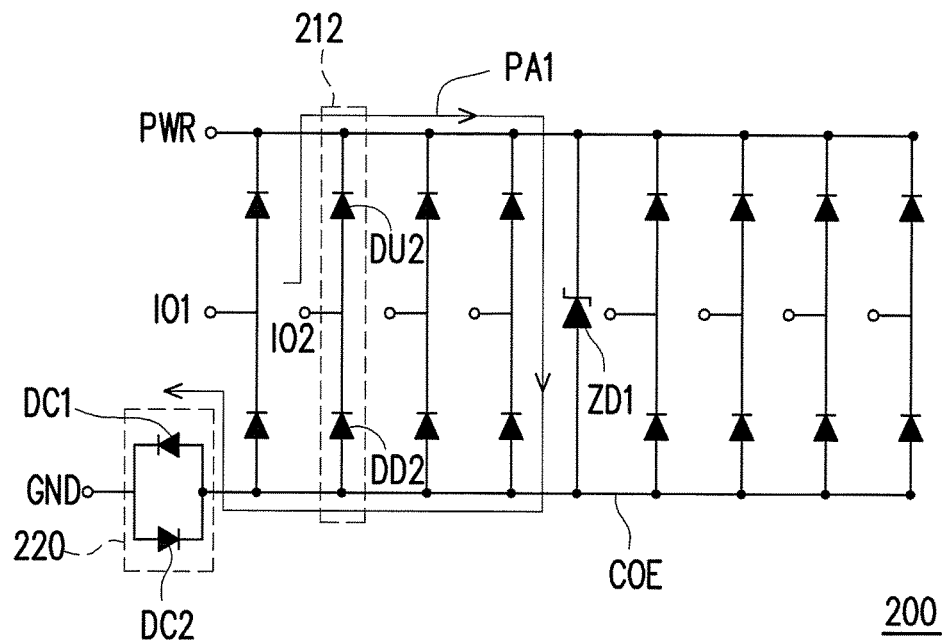
FIG. 3A and FIG. 3B are schematic diagrams respectively illustrating operations of the multi-channel transient voltage suppressor in response to different conditions of the ESD phenomenon according to embodiments of the invention.
Figure 3B:
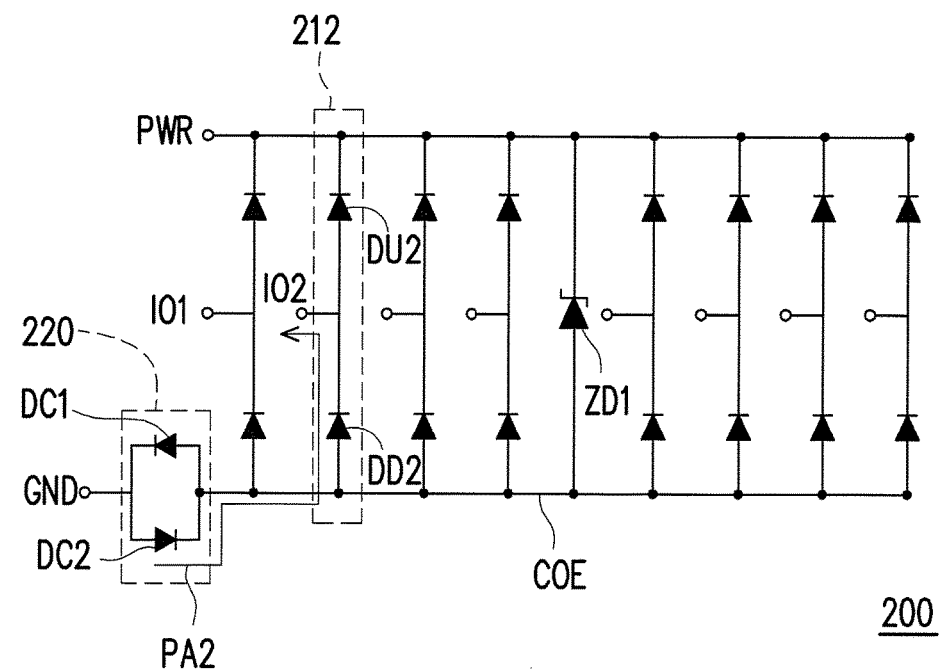

FIG. 3A and FIG. 3B are schematic diagrams respectively illustrating operations of the multi-channel transient voltage suppressor during the ESD phenomenon according to embodiments of the invention. In FIG. 3A, for example, a forward electrostatic discharge voltage exists in the input output terminal IO2 (i.e., a voltage value of the electrostatic discharge voltage is greater than 0V), and thus the diode DU2 in the diode string 212 is turned on. In this case, the Zener breakdown will occur on the Zener diode ZD1 so the bypass diode DC1 is correspondingly turned on. Accordingly, when the forward electrostatic discharge voltage is applied to the input output terminal IO2, a current dissipation path PA1 is generated. An electrostatic discharge current may be dissipated by the current dissipation path PA1 to achieve the effectiveness of the ESD protection.

On the other hand, referring to FIG. 3B, when a reverse electrostatic discharge voltage exists in the input output terminal IO2 (i.e., the voltage value of the electrostatic discharge voltage is less than 0V), the channeling diodes DD2 and the bypass diode DC2 are turned on and a current dissipation path PA2 is formed. The electrostatic discharge current generated by the ESD phenomenon may be dissipated by the current dissipation path PA2 to achieve the effectiveness of the ESD protection.

In view of the above description, it can be known that, in the embodiments of the invention, the current dissipation path PA1 may be generated by arranging one or more upper diodes (e.g., the channeling diode DU2) between the input output terminals IO1 to ION and the power terminal PWR in cooperation with the bypass diode DC1 in the diode array 220. Further, another current dissipation path PA2 may be generated by arranging one or more lower diodes (e.g., the channeling diode DD2) between the input output terminals IO1 to ION and the common bus COE in cooperation with the bypass diode DC2 in the diode array 220. As a result, the electrostatic discharge currents generated by different conditions of the ESD phenomenon may both be dissipated to achieve the effectiveness of ESD protection. The point is that, the equivalent capacitances on the current dissipation paths may all be effectively reduced through the bypass diode DC1 coupled to the upper diode in series or through the bypass diode DC2 coupled to the lower diode in series to improve the effectiveness of the ESD protection.

By arranging two bypass diodes DC1 and DC2 as shown in the embodiments of the invention, regardless of how many channels are provided by the multi-channel transient voltage suppressor 200, the equivalent capacitances on the current dissipation paths may all be effectively reduced without correspondingly arranging additional diodes, such that a layout area required by the multi-channel transient voltage suppressor 200 may be effectively saved.

Figure 4:
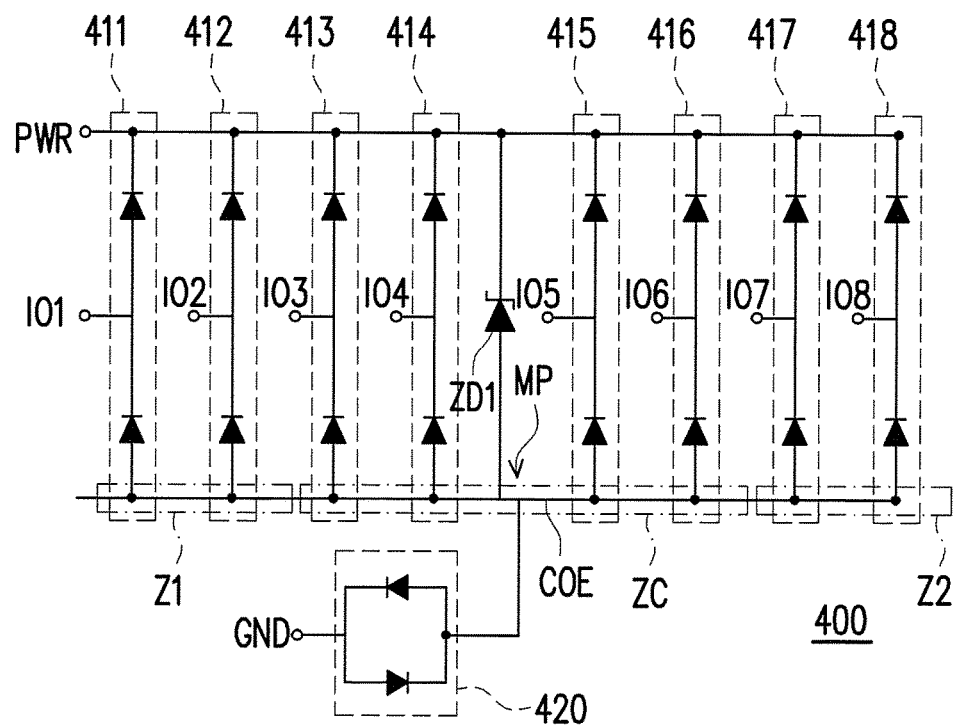
FIG. 4 is a schematic diagram illustrating a circuit arrangement of the multi-channel transient voltage suppressor according to an embodiment of the invention.

FIG. 4 is a schematic diagram illustrating a circuit arrangement of the multi-channel transient voltage suppressor according to an embodiment of the invention. A multi-channel transient voltage suppressor 400 includes a plurality of diode strings 411 to 418, a Zener diode ZD1, a common bus COE and a diode array 420, wherein a position of the diode array 420 may be adaptively adjusted. For instance, the common bus COE may have a plurality of connection nodes and include edge zones Z1 and Z2 and a center zone ZC. The diode strings 411 to 414 and the diode strings 415 to 418 are arranged in symmetrical manner with respect to a center point MP of the center zone ZC. The diode array 420 may be arranged in the center zone ZC and adjacent to the center point MP, or may be directly arranged on the center point MP and coupled to the common bus COE. Accordingly, lengths of the current dissipation paths from the input output terminals IO1 to IO1 to the diode array 420 may be more even.

Further, the diode array 420 may also be arranged in the edge zones Z1 or Z2 and coupled to the common bus COE (as shown by FIG. 2). The difficulty of the circuit layout for arranging the diode array 420 in the edge zones Z1 or Z2 is relatively lower, and the circuit area may also be optimized easier by doing the same.

In summary, by arranging the diode array formed by two back-to-back diodes in the foregoing embodiments of the invention, the equivalent capacitances on the current dissipation paths may be reduced accordingly. As a result, regardless of how many channels are included in the multi-channel transient voltage suppressor, the capacitance values of the multi-channel transient voltage suppressor may be reduced under premise that the circuit area is not increased to improve the effectiveness of the ESD protection.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-channel transient voltage suppressor, comprising:
    a power terminal;
    a ground terminal;
    a common bus;
    a plurality of diode strings, coupled between the power terminal and the common bus, wherein each of the diode strings is coupled to one input output terminal;
    a Zener diode, coupled between the power terminal and the common bus; and
    a diode array, coupled between the common bus and the ground terminal, wherein the diode array comprises a first bypass diode and a second bypass diode, an anode of the first bypass diode being coupled to the ground terminal and a cathode of the second bypass diode, an anode of the second bypass diode being coupled to the common bus and a cathode of the first bypass diode,
    wherein the common bus comprises an edge zone and a center zone and has a plurality of connection nodes, the diode array being connected to one of the connection nodes in the common bus.

2. The multi-channel transient voltage suppressor of claim 1, wherein each of the diode strings comprises a first channeling diode and a second channeling diode, the first channeling diode and the second channeling diode being connected in series, the input output terminal being coupled to a common joint between the first channeling diode and the second channeling diode, another terminal of the first channeling diode being coupled to the power terminal, another terminal of the second channeling diode being coupled to the common bus.

3. The multi-channel transient voltage suppressor of claim 1, wherein when an electrostatic discharge voltage higher than a ground terminal voltage exists in one of the input output terminals, a first current dissipation path passing through the input output terminal, the first channeling diode, the power terminal, the Zener diode, the common bus and the first bypass diode to the ground terminal is formed.

4. The multi-channel transient voltage suppressor of claim 1, wherein when an electrostatic discharge voltage lower than a ground terminal voltage exists in one of the input output terminals, a second current dissipation path passing through the ground terminal, the second bypass diode, the common bus and one of the second channeling diodes to the input output terminal coupled to said one of the second channeling diodes is formed.

5. The multi-channel transient voltage suppressor of claim 1, wherein the diode array is connected to the connection node of the center zone.

6. The multi-channel transient voltage suppressor of claim 1, wherein the diode array is connected to the connection node of the edge zone.

7. A multi-channel transient voltage suppressor, comprising:
    a plurality of diode strings, coupled between a power terminal and a common bus, each of the diode strings comprising a corresponding input output terminal;
    a Zener diode, coupled between the power terminal and the common bus; and
    one diode array, comprising:
    a first bypass diode, coupled between the common bus and a reference ground terminal, and providing a first current dissipation path from the common bus to the reference ground terminal; and
    a second bypass diode, coupled to the first bypass diode in reverse parallel, and providing a second current dissipation path from the reference ground terminal to the common bus,
    wherein the common bus comprises an edge zone and a center zone and has a plurality of connection nodes, the diode array being connected to one of the connection nodes in the common bus.

* * * * *